(12) United States Patent
Park et al.

(10) Patent No.: US 9,217,890 B2
(45) Date of Patent: Dec. 22, 2015

(54) TOUCH SCREEN PANEL AND METHOD FOR MANUFACTURING THE SAME

(71) Applicant: Samsung Display Co., Ltd., Yongin, Gyeonggi-Do (KR)

(72) Inventors: Hee-Woong Park, Yongin (KR); Byeong-Kye Jeon, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 75 days.

(21) Appl. No.: 14/154,979

(22) Filed: Jan. 14, 2014

(65) Prior Publication Data

US 2014/0198266 A1 Jul. 17, 2014

(30) Foreign Application Priority Data

Jan. 16, 2013 (KR) ........................ 10-2013-0005048

(51) Int. Cl.
*G06F 3/041* (2006.01)
*G02F 1/1333* (2006.01)
*G06F 3/044* (2006.01)
*H05K 1/09* (2006.01)
(Continued)

(52) U.S. Cl.
CPC ............ *G02F 1/13338* (2013.01); *G06F 3/044* (2013.01); *H05K 1/097* (2013.01); *B82Y 15/00* (2013.01); *G06F 2203/04102* (2013.01); *G06F 2203/04103* (2013.01); *G06F 2203/04112* (2013.01); *H01L 27/323* (2013.01); *H05K 1/0289* (2013.01); *H05K 3/22* (2013.01); *H05K 3/288* (2013.01); *H05K 3/4685* (2013.01); *H05K 2201/026* (2013.01); *H05K 2201/0329* (2013.01); *H05K 2201/0391* (2013.01); *H05K 2201/10053* (2013.01); *H05K 2201/10128* (2013.01); *H05K 2203/173* (2013.01); *Y10T 29/49016* (2015.01)

(58) Field of Classification Search
CPC ..................... G02F 1/13338; Y10T 29/49016; H01L 27/323; H05K 1/0189; H05K 1/097; H05K 3/22; H05K 3/288; H05K 3/4685; H05K 1/026; H05K 2201/0329; H05K 2201/0391; H05K 2201/10053; H05K 2201/10128; H05K 2203/173; G06F 3/044; G06F 2203/04102; G06F 2203/04103; G06F 2203/04112; B82Y 15/00
See application file for complete search history.

(56) References Cited

U.S. PATENT DOCUMENTS

2010/0171718 A1* 7/2010 Denda ........................... 345/173
2010/0233930 A1* 9/2010 Ishida et al. .................... 445/24
(Continued)

FOREIGN PATENT DOCUMENTS

KR 10-2007-0007996 A 1/2007
KR 10-2008-0066658 A 7/2008
KR 10-2011-0071539 A 6/2011

*Primary Examiner* — Charles V Hicks
(74) *Attorney, Agent, or Firm* — Knobbe Martens Olson & Bear LLP

(57) ABSTRACT

In an aspect, a touch screen panel including a sensing region and a peripheral region, a plurality of first sensing patterns located in the sensing region, a plurality of second sensing patterns arranged in an intersected direction with the first sensing patterns connected to each other by a connection part, an insulating layer formed on the first sensing pattern, the second sensing pattern, and the connection part, and patterned to expose both side of the first sensing pattern, at least one bridge located to intersect with the connection part on the insulating layer; and a plurality of wires located on a peripheral region and connected to the first sensing pattern and the second sensing pattern are provided.

22 Claims, 5 Drawing Sheets

(51) Int. Cl.
  *B82Y 15/00*  (2011.01)
  *H01L 27/32*  (2006.01)
  *H05K 1/02*   (2006.01)
  *H05K 3/22*   (2006.01)
  *H05K 3/28*   (2006.01)
  *H05K 3/46*   (2006.01)

(56) References Cited

U.S. PATENT DOCUMENTS

2010/0260745 A1\* 10/2010 Zhou et al. ................. 424/130.1
2013/0000952 A1\* 1/2013 Srinivas et al. ............ 174/126.1

\* cited by examiner

TOUCH SCREEN PANEL AND METHOD FOR MANUFACTURING THE SAME

INCORPORATION BY REFERENCE TO ANY PRIORITY APPLICATIONS

Any and all applications for which a foreign or domestic priority claim is identified in the Application Data Sheet as filed with the present application, are hereby incorporated by reference under 37 CFR 1.57. For example, this application claims priority to and the benefit of Korean Patent Application No. 10-2013-0005048, filed on Jan. 16, 2013, in the Korean Intellectual Property Office, the disclosure of which is incorporated herein by reference in its entirety.

BACKGROUND

1. Field

The described technology generally relates to a touch screen panel and a method for manufacturing the same, more particularly, a touch screen panel capable of reducing manufacture steps and a method for manufacturing the same.

2. Description of the Related Technology

A liquid crystal display (LCD) or an organic light emitting display (OLED) may include a touch screen panel. The touch screen panel is a device for inputting a user's command by contant with a user's hand or a pen. The touch screen panel senses capacitance or voltage change between two electrodes to recognize the contacted position, and then supplies the user's command according to the position to a display device.

The touch screen panel includes two sensing electrodes typically formed of a transparent conductive material, such as indium tin oxide (ITO), and a wire formed of metal having a low surface resistance.

In order to manufacture a touch screen panel, a mask for forming sensing electrodes and wires are needed, photolithography processes and etching processes are carried out by using the masks. The photolithography process includes forming a photoresist, exposing the photoresist using a mask, and developing the exposed photoresist.

Typically a single photolithography process includes several steps. Thus, in the case in which a photolithography process is added, the entire manufacture step may be complicated when photolithography is included in the manufacturing process. In addition, contamination and defects may be generated during forming and removing the photolithography components.

SUMMARY

Some embodiments provide a touch screen panel capable of reducing the number of mask, and a method for manufacturing the same.

Some embodiments provide a touch screen panel capable of reducing a step of manufacturing mask, and a method for manufacturing the same.

Some embodiments provide a touch screen panel including: a substrate having regions corresponding to a sensing region and a peripheral region; a plurality of first sensing patterns and a plurality of second sensing patterns both including a first nanowire layer, wherein the plurality of first sensing patterns are located in the region corresponding to the sensing region of the substrate each separately arranged from each other in a direction, the plurality of second sensing patterns is arranged in an intersected direction with the first sensing pattern to be connected to each other by a connection part, and the first nanowires have a first density; an insulating layer formed on the first sensing pattern, the second sensing pattern, and the connection part, in a pattern exposing both sides of the first sensing pattern; at least one bridge disposed to be intersected with the connection part on the insulating layer and connecting to an exposed part of the first sensing pattern; and a plurality of wires disposed on a peripheral region of the substrate and respectively connected to the first sensing pattern and the second sensing pattern and including second nanowires having a second density which is higher than the first density Some embodiments provide a method for manufacturing a touch screen panel including: forming a first nanowire layer and a second nanowire layer, wherein the second nanowire layer has a higher density than the first nanowire layer; forming a sensing electrode on the first nanowire layer in a sensing region and forming a wire from the second nanowire layer in a peripheral region by sequentially removing material from the first nanowire layer and the second nanowire layer; exposing both sides of the sensing electrode by forming an insulating layer on the sensing electrode and the wire to form exposed sensing electrodes; and forming a bridge on the insulating layer connecting the exposed sensing electrodes to each other.

Some embodiments provide a method for manufacturing a touch screen panel including: forming a first nanowire layer on a sensing region and forming a second nanowire layer higher than a first density on a peripheral region; forming a sensing electrode on the first nanowire layer in the sensing region and forming a wire including the second nanowire layer on the peripheral region by sequentially patterning portions of the first and second density nanowire layers; exposing both sides of the sensing electrode by forming an insulating layer on the sensing electrode and the wire; and forming a bridge on the insulating layer connecting the exposed sensing electrodes to each other.

BRIEF DESCRIPTION OF THE DRAWINGS

The accompanying drawings, together with the specification, illustrate exemplary embodiments of the present embodiments, and, together with the description, serve to explain the principles of the present embodiments.

DETAILED DESCRIPTION

Figure 1:
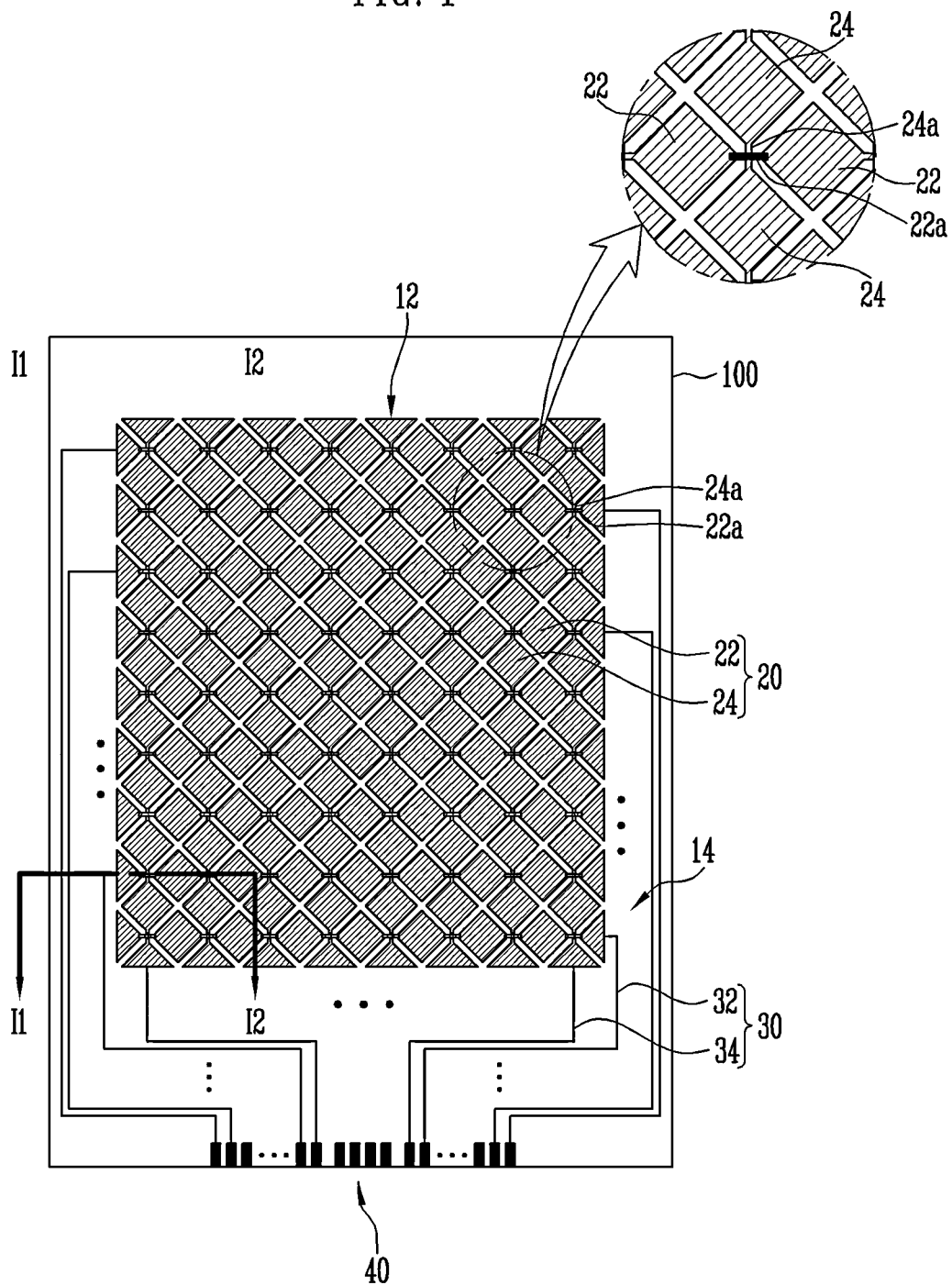
FIG. 1 is a plan view schematically describing a touch screen panel according to an exemplary embodiment.

In the following detailed description, only certain exemplary embodiments of the present disclosure have been shown and described, simply by way of illustration. It is to be understood, the described embodiments may be modified in various different ways, all without departing from the spirit or scope of the present disclosure. Accordingly, the drawings and description are to be regarded as illustrative in nature and not restrictive. In addition, when an element is referred to as being "on" another element, it can be directly on the described element or be indirectly on the described element with one or more intervening elements interposed therebetween. Also, when an element is referred to as being "connected to" another element, it can be directly connected to the described element or be indirectly connected to the described element with one or more intervening elements interposed therebetween. Hereinafter, like reference numerals refer to like elements.

Hereinafter, embodiments of the present disclosure will be described in detail with reference to the accompanying drawings. The following exemplary embodiment is provided for illustrative purposes and various changes in form and details may be made therein. Therefore, the scope of the present invention is not limited to the exemplary embodiments set forth herein.

FIG. 1 is a plan view schematically showing a touch screen panel according to an exemplary embodiment.

Referring to FIG. 1, a substrate 100 includes a sensing region 12 and a peripheral region 14.

In some embodiments, the substrate 100 is made of a rigid substrate or a flexible substrate formed of transparent conductive material, such as glass or plastic.

In some embodiments, the sensing region 12 is a region that sensing a touched position by a hand or an object, for example, may be disposed on the center of the substrate 100, and a plurality of sensing electrodes 20 is formed on the substrate 100 of the sensing region 12. In some embodiments, a plurality of sensing electrode 20 may include a plurality of first sensing patterns 22 arranged in a direction (for example, X direction) to be connected to each other and a plurality of second sensing patterns 24 arranged in an intersecting direction with the first sensing pattern 22 (for example, Y direction) to be connected to each other.

In some embodiments, any one of the first sensing pattern 22 and the second sensing pattern 24 may be separately formed as an independent pattern not to be connected to each other and is connected to each other through a bridge. For example, in the case where the second sensing pattern 24 is formed in connected state by a connection part 24a, the first sensing pattern 22 may be separately formed from each other and connected to each other through the bridge 22a. In some embodiments, the bridge 22a may be intersected with the connection part 24a of the second sensing pattern 24 and may be electrically insulated from the connection part 24a of the second sensing pattern 24 by an insulating layer (not shown).

In some embodiments, the first sensing pattern 22, the second sensing pattern 24, and the connection part 24a may be formed of a transparent conductive material. As the above mentioned conductive material at least one nanowire may be used. For example, the at least one nanowire may be selected from a silver (Ag) nanowire, a gold (Au) nanowire, a platinum (Pt) nanowire, a copper Cu nanowire, and a nickel (Ni) nanowire. In some embodiments, the nanowire material may be applied at a predetermined density, for example, a first density, to have surface resistance of approximately 50 $\Omega/\square$ to 300 $\Omega/\square$, preferably, approximately 100 $\Omega/\square$ to 200 $\Omega/\square$.

In some embodiments, the bridge 22a may be formed of a metal selected from a group consisting of molybdenum (Mo), silver (Ag), titanium (Ti), aluminum (Al), and copper (Cu) or one or more alloys thereof, a transparent conductive material such as indium tin oxide (ITO), indium zinc oxide (IZO), or the like, or a conductive polymer.

In some embodiments, the insulating layer may be formed on the first sensing pattern 22, the second sensing pattern 24, and the connection part 24a, and then may be patterned to expose both side of the first sensing pattern 22. In some embodiments, the bridge 22a may be intersected with the connection part 24a on the insulating layer, and connect the exposed part of the adjacent first sensing pattern 22 to each other.

In some embodiments, the peripheral region 14 is a peripheral part of the sensing region 12, a plurality of the wires 30 connected to a plurality of the sensing electrode 20 and a pad part 40 connected to a plurality of the wires 30 may be formed on the substrate 100 of the peripheral region 14. For example, a wire 32 may be formed to be connected to a plurality of the first sensing patterns 22 and a wire 34 may be formed to be connected to a plurality of the second sensing patterns 24.

In some embodiments, the wire 30 may be formed of a conductive material having low resistance value smaller than the sensing electrode 20, and may be formed of an opaque material. In some embodiments, the wire 30 may be formed of at least one nanowire. In some embodiments, the at least one nanowire is selected from a silver (Ag) nanowire, a gold (Au) nanowire, a platinum (Pt) nanowire, a copper Cu nanowire, and a nickel (Ni) nanowire. In some embodiments, the nanowire may be applied at predetermined density, for example, a second density, to have surface resistance of approximately 0.1 $\Omega/\square$ to 0.9 $\Omega/\square$, and preferably, approximately 0.1 $\Omega/\square$ to 0.3 $\Omega/\square$.

In some embodiments, the pad part 40 may be electrically connected to a driving circuit board (not shown) for driving a touch screen panel.

Figure 2A:
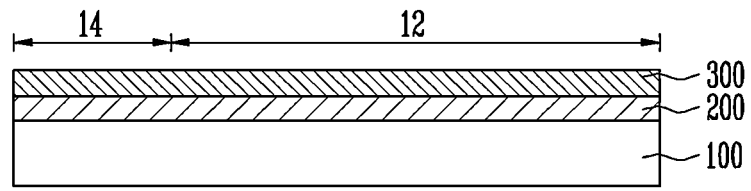
FIGS. 2A to 2D are cross-sectional views describing a method for manufacturing a touch screen panel according to an exemplary embodiment.
Figure 2B:
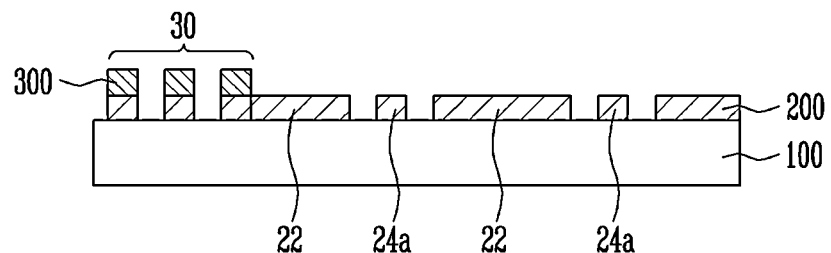
Figure 2C:
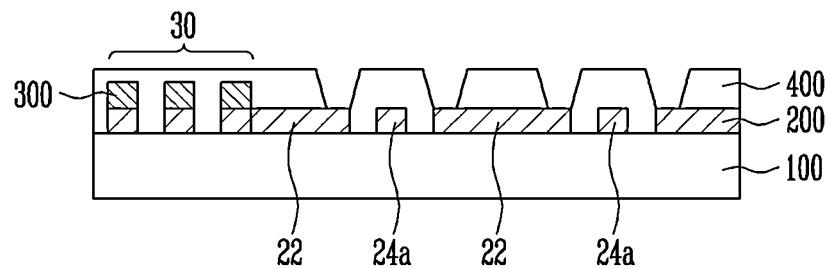
Figure 2D:
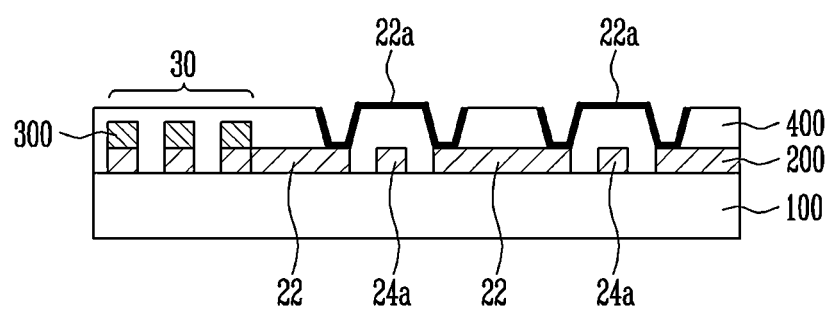
Figure 3A:
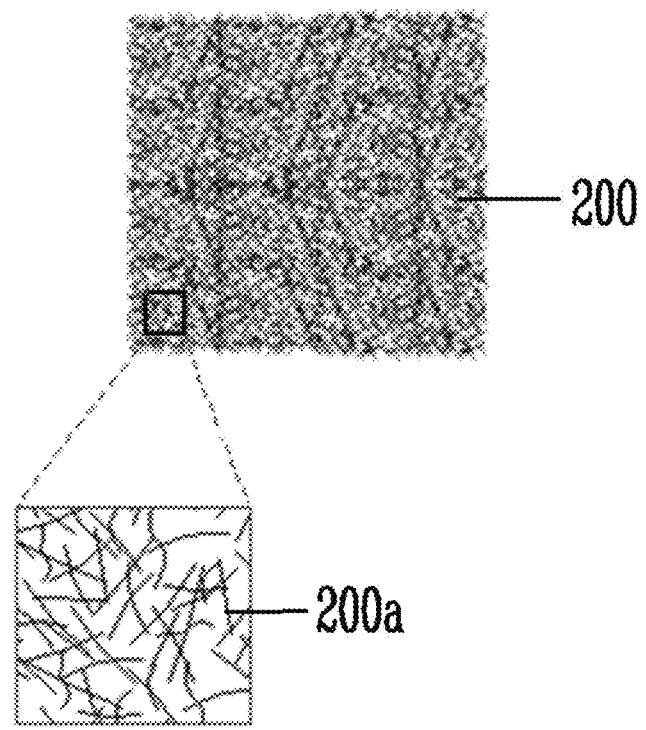
FIGS. 3A to 3B are plan views describing a method for manufacturing a touch screen panel according to an exemplary embodiment.
Figure 3B:
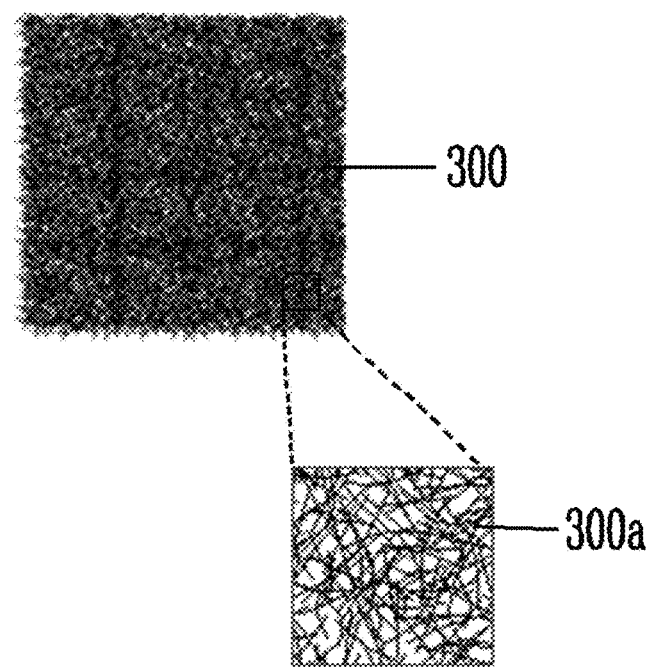

FIGS. 2A to 2D are cross-sectional views describing a method for manufacturing a touch screen panel according to exemplary embodiment, FIGS. 3A to 3B are plan views describing a method for manufacturing a touch screen panel according to exemplary embodiment. For convenience of description, a cross-sectional view taken along line I1 to I2 of FIG. 1 will be described.

Referring to FIG. 2A, a nanowire layer 200 having the first density and a nanowire layer 300 having the second density higher than the first density may be formed by sequentially coating the substrate 100.

In some embodiments, the substrate 100 includes the sensing region 12 and the peripheral region 14, and the nanowire layers 200 and 300 may be formed by sequentially coating on the substrate 100 having the sensing region 12 and the peripheral region 14.

In some embodiments, the substrate 100 may be made of a rigid substrate or a flexible substrate formed of transparent conductive material, such as glass or plastic.

In some embodiments, the nanowire layers 200 and 300 may be formed of silver (Ag) nanowires, gold (Au) nanowires, platinum (Pt) nanowires, copper Cu nanowires, nickel (Ni) nanowires, or the like. In some embodiments, the nanowire mixed with solvent may be applied at a first density to have surface resistance of approximately 50 $\Omega/\square$ to 300 $\Omega/\square$, to form the nanowire layer 200, and then may be applied on the nanowire layer 200 at a second density to have surface resistance of approximately 0.1 $\Omega/\square$ to 0.9 $\Omega/\square$, to form the nanowire layer 300.

In some embodiments, the nanowire may be applied by a bar coating, a slit coating, a drop coating, or the like.

FIG. 3A is a plan view of the nanowire layer 200 applied having a first density. In some embodiments, the surface resistance thereof is higher than the nanowire layer 300 since the nanowire 200a is applied having a relatively low density. However, high permeability, for example, the nanowire layer 200 may have 80% or above light permeability in visible ray region.

FIG. 3B is a planar view of the nanowire layer 300 applied at the second density. Since the nanowire 300a is applied at relatively high density, the permeability thereof is high, however, nanowire layer 300 may have surface resistance lower than that of the nanowire 200.

In some embodiments, the first density and the second density may be divided, for example, by difference of the number of nanowires.

Referring to FIG. 2B, the nanowire layers 200 and 300 may be sequentially patterned to form the sensing electrode 20 on the sensing region 12 and to form the wire 30 on the peripheral region 14. In some embodiments, the nanowire layers 200 and 300 may be patterned by photolithography process using photoresist, etching process, or using laser.

In some embodiments, the sensing electrode 20 shown in FIG. 1 may be fabricated from the transparent nanowire layer 200 shown in FIG. 2A. In some embodiments, the wire 30 shown in FIG. 2B may be formed by removing material from the nanowire layer 300 shown in FIG. 2A in a pattern and may be located in peripheral region 14.

In some embodiments, the sensing electrode 20 may be fabricated from the nanowire layer 200 shown in FIG. 2A, and includes a plurality of the first sensing pattern 22 which is arranged in a direction (for example, X direction) to be separated from each other and a plurality of second sensing patterns 24 which is arranged in the intersecting direction with the first sensing pattern 22 (for example, Y direction) to be connected to each other by the connection part 24a shown in FIG. 2B.

In some embodiments, the wire 30 is configured to connect the structure in which the nanowire layer 300 is stacked with the portion of the nanowire layer 200 disposed below the nanowire layer 300, and includes the wire 32 connected to a plurality of the first sensing pattern 22 and the wire 34 connected to a plurality of the second sensing pattern 24 as shown in FIG. 2B. When the. In some embodiments, the resistance value may be reduced by using wire 30 in comparison to a single continuous layer structure of nanowire layer 300 which may be formed by patterning the nanowire layer 300.

Referring to FIG. 2C, the insulating layer 400 is formed from insulating material on the substrate 100 including the sensing electrode 20 and the wire 30 by patterning the insulating material. In some embodiments, the insulating layer 400 may be formed by a physical method such as a coating method. In some embodiments, the insulating layer 400 may be formed of an organic material such as photosensitive organic material, photoresist, etc.

Referring to FIG. 2D, a conductive layer is formed at a predetermined thickness on the insulating layer 400 and the exposed sensing electrode 20 and then is patterned, where the bridge 22a is formed such that the adjacent sensing electrode 20 is connected to each other.

In some embodiments, the conductive layer may be formed of one metal selected from a group consisting of molybdenum (Mo), silver (Ag), titanium (Ti), aluminum (Al), and copper (Cu) or one or more alloys thereof, a transparent conductive material such as indium tin oxide (ITO), indium zinc oxide (IZO), or the like, or a conductive polymer.

Figure 4A:
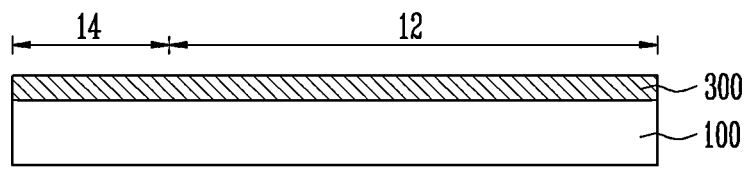
FIGS. 4A to 4E are cross-sectional views describing a method for manufacturing a touch screen panel according to another embodiment.
Figure 4B:
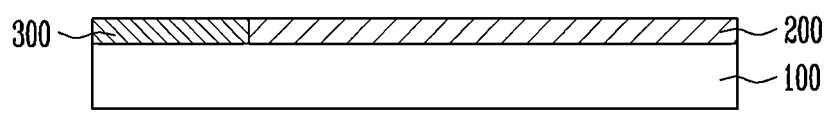
Figure 4C:
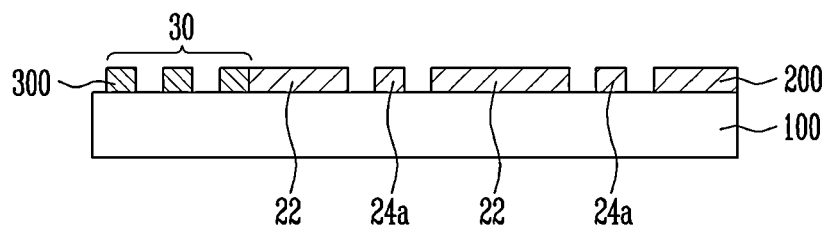
Figure 4D:
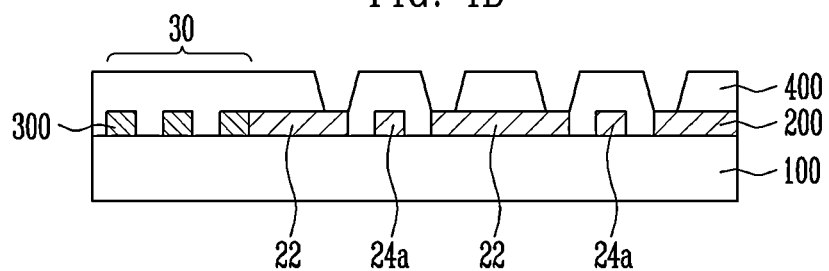
Figure 4E:
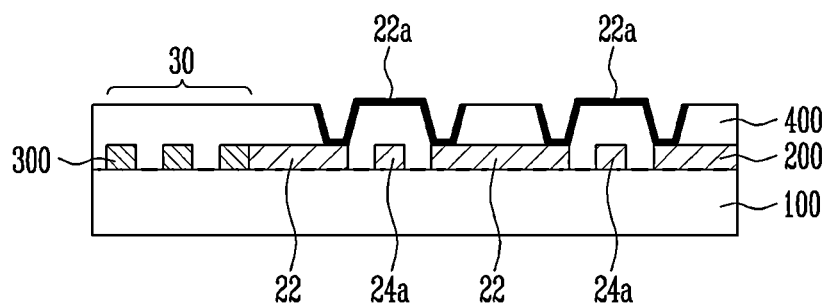
Figure 5:
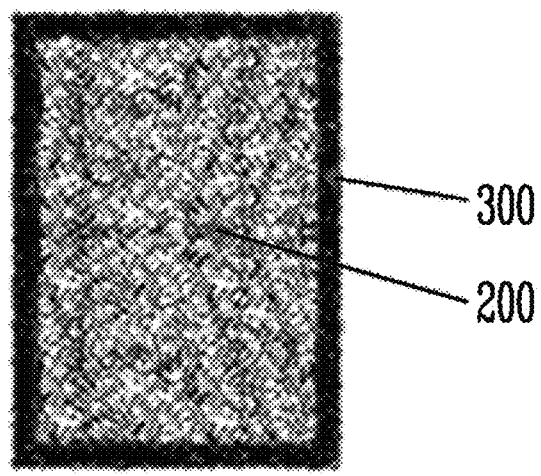
FIG. 5 is a plan view describing a method for manufacturing a touch screen panel according to another embodiment.

FIGS. 4A to 4E are cross-sectional views that show incorporation and removal of components during steps of a method for manufacturing a touch screen panel according to another embodiment, FIG. 5 is a planar view describing a touch screen panel according to another embodiment of the present invention. For convenience of description, a cross-sectional view taken along line I1 to I2 of FIG. 1 will be described.

Referring to FIG. 4A, the second density of nanowire layer 300 is formed by coating material on the substrate 100. The second density of nanowire layer 300 may be formed as described above regarding in FIG. 2A.

In some embodiments, the substrate 100 includes the nanowire layer 300 in regions that will become the sensing region 12 and the peripheral region 14.

In some embodiments, the substrate 100 is made of a rigid substrate or a flexible substrate formed of transparent conductive material, such as glass or plastic.

Referring to FIG. 4B, after removing the nanowire layer 300 material from the sensing region 12, the first density of nanowire layer 200 may be formed on the substrate 100 in the corresponding area where the nanowire layer 300 material was removed from sensing region 12. The nanowire layer 200 may be formed as described in FIG. 2A, and may be easily formed by using a drop coating process.

As described in FIG. 5, the second density of nanowire layer 200 is formed on the substrate 100 on the sensing region 12, and the second density of nanowire layer 300 is formed on the peripheral region 14.

Referring to FIG. 4C, the nanowire layers 200 and 300 (shown in FIG. 4B) are patterned to form the sensing electrode 20 shown in FIG. 1 in the sensing region 12 and to form the wire 30 in the peripheral region 14. In some embodiments, the nanowire layers 200 and 300 (shown in FIG. 4B) may be patterned by photolithography process using photoresist, etching process, or by using laser.

Referring to the 4D, the insulating layer 400 is formed from insulating material on the substrate 100 including the sensing electrode 20 and the wire 30 by patterning the insulating material.

Referring to FIG. 4E, a conductive layer material is formed on the insulating layer 400 and the exposed sensing electrode 20 at a predetermined thickness and then is patterned to form the conductive layer, the bridge 22a is formed such that adjacent sensing electrodes connected to each other such as sensing electrodes 20 shown in FIG. 1.

In some embodiments, the conductive layer may be formed of one metal selected from a group consisting of molybdenum (Mo), silver (Ag), titanium (Ti), aluminum (Al), and copper (Cu) or one or more alloys thereof, a transparent conductive material such as indium tin oxide (ITO), indium zinc oxide (IZO), or the like, or a conductive polymer.

In the case in which the sensing electrode 20 and wire 30 are formed of different material from each other, the adhesion between each material may be low, in this case, the resistance of the wire may be increased or a disconnection may be generated. In addition, a mask for patterning each material and a step for manufacturing are needed.

In some embodiments, the sensing electrode 20 and the wire 30 may be formed of same material, thereby making it possible to solve the problem of low adhesion. Also, flexibility of the touch screen panel may be improved by using flexible nanowire.

In some embodiments, the sensing electrode and the wire of the touch screen panel are formed of same material. The sensing electrode and the wire are formed of same material and patterned to control permeability and surface resistance by controlling density of the nanowire. Accordingly, masks and manufacture steps can be reduced compared with the using different material. Since defects due to a contamination generated at the time of photolithography process is reduced, the productivity is improved and manufacture cost can be reduced. Also, flexibility of the touch screen panel may be improved by using flexible nanowire.

While the present embodiments have been described in connection with certain exemplary embodiments, it is to be understood that the invention is not limited to the disclosed embodiments and is intended to cover various modifications and equivalent arrangements included within the spirit and scope of the appended claims, and equivalents thereof.

What is claimed is:

1. A touch screen panel comprising,
a substrate having regions corresponding to a sensing region and a peripheral region;
a plurality of first sensing patterns and a plurality of second sensing patterns both including a first nanowire layer, wherein the plurality of first sensing patterns are located in the region corresponding to the sensing region of the substrate each separately arranged from each other in a direction, the plurality of second sensing patterns is arranged in an intersected direction with the first sensing pattern to be connected to each other by a connection part, and the first nanowire layers have a first density;
an insulating layer formed on the first sensing pattern, the second sensing pattern, and the connection part, in a pattern exposing both sides of the first sensing pattern;
at least one bridge disposed to be intersected with the connection part on the insulating layer and connecting to an exposed part of the first sensing pattern; and
a plurality of wires disposed on a peripheral region of the substrate and respectively connected to the first sensing pattern and the second sensing pattern and including a second nanowire layer having a second density which is higher than the first density.

2. The touch screen panel of claim 1, wherein the substrate is a flexible substrate.

3. The touch screen panel of claim 1, wherein the second nanowire layer has surface resistance lower than that of the first nanowire layers.

4. The touch screen panel of claim 3,
wherein the first nanowire layers have a surface resistance of approximately 50 Ω/□ to 300 Ω/□, and the second nanowires have a surface resistance of approximately 0.1 Ω/□ to 0.9 Ω/□.

5. The touch screen panel of claim 1,
wherein the second nanowire layer has permeability lower than that of the first nanowire layers.

6. The touch screen panel of claim 5, wherein the first nanowire layers are transparent, and the second nanowire layer is opaque.

7. The touch screen panel of claim 1,
wherein the first nanowire layers include one selected from silver (Ag) nanowires, gold (Au) nanowires, platinum (Pt) nanowires, copper (Cu) nanowires, and nickel (Ni) nanowires.

8. The touch screen panel of claim 1,
wherein the first nanowire layers are located below the second nanowire layer.

9. The touch screen panel of claim 1,
wherein the bridge is one or more of metal, transparent conductive material, and conductive polymer.

10. The touch screen panel of claim 9,
wherein the bridge is one or more selected from a group of molybdenum (Mo), silver (Ag), titanium (Ti), aluminum (Al), and copper (Cu) or alloy thereof.

11. A method for manufacturing a touch screen panel comprising,
forming a first nanowire layer and a second nanowire layer, wherein the second nanowire layer has a higher density than the first nanowire;
forming a sensing electrode composed of the first nanowire layer in a sensing region and forming a wire from the second nanowire layer in a peripheral region by sequentially removing material from the second nanowire layer and the first nanowire layer;
exposing both sides of the sensing electrode by forming an insulating layer on the sensing electrode and the wire to form exposed sensing electrodes; and
forming a bridge on the insulating layer connecting the exposed sensing electrodes to each other.

12. The method of claim 11,
wherein the first nanowire layer is formed by mixing nanowire with solvent and then applying to have surface resistance of approximately 50 Ω/□ to 300 Ω/□,
wherein the second nanowire layer is formed by mixing the nanowire with solvent and then applying to have surface resistance of approximately 0.1 Ω/□ to 0.9 Ω/□.

13. The method for manufacturing a touch screen panel according to claim 11,
wherein the sensing electrode includes a plurality of first sensing patterns separated from each other in a direction and then arranged;
and a plurality of second sensing patterns arranged on in intersected direction with the first sensing patterns to be connected to each other by a connection part,
and allows adjacent both sides of the first sensing pattern to be connected to the bridge.

14. The method for manufacturing a touch screen panel according to claim 12, wherein the nanowire is one selected from a group of including a silver (Ag) nanowire, a gold (Au) nanowire, a platinum (Pt) nanowire, a copper (Cu) nanowire, and a nickel (Ni) nanowire.

15. The method for manufacturing a touch screen panel according to claim 11,
wherein the bridge is one or more of metal, transparent conductive material, and conductive polymer.

16. The method for manufacturing a touch screen panel according to claim 15, wherein the metal is a metal or at least one alloy selected from a group of molybdenum (Mo), silver (Ag), titanium (Ti), aluminum (Al), and copper (Cu).

17. A method for manufacturing a touch screen panel comprising,
forming a first nanowire layer on a sensing region and forming a second nanowire layer higher than a first density on a peripheral region;
forming a sensing electrode on the first nanowire layer in the sensing region and forming a wire including the second nanowire layer on the peripheral region by sequentially patterning portions of the first and second density nanowire layers;
exposing both sides of the sensing electrode by forming an insulating layer on the sensing electrode and the wire; and
forming a bridge on the insulating layer connecting the exposed sensing electrodes to each other.

18. The method for manufacturing a touch screen panel according to claim 17,
wherein the first nanowire layer is formed by mixing nanowire with solvent and then applying to have surface resistance of approximately 50 Ω/□ to 300 Ω/□
wherein the second nanowire layer is formed by mixing nanowire with solvent and then applying to have surface resistance of approximately 0.1 Ω/□ to 0.9 Ω/□.

19. The method for manufacturing a touch screen panel according to claim 17,
wherein the sensing electrode includes a plurality of first sensing patterns separated from each other in a direction and then arranged; and
a plurality of second sensing patterns arranged on in intersected direction with the first sensing patterns to be connected to each other by a connection part, and allows adjacent both sides of the first sensing pattern to be connected to the bridge.

20. The method for manufacturing a touch screen panel according to claim 18, wherein the nanowire is one selected from a group of including a silver (Ag) nanowire, a gold (Au) nanowire, a platinum (Pt) nanowire, a copper (Cu) nanowire, and a nickel (Ni) nanowire.

21. The method for manufacturing a touch screen panel according to claim 17,
   wherein the bridge is one or more of metal, transparent conductive material, and conductive polymer.

22. The method for manufacturing a touch screen panel according to claim 21, wherein the bridge is one or more selected from a group of molybdenum (Mo), silver (Ag), titanium (Ti), aluminum (Al), and copper (Cu) or alloy thereof.

* * * * *